United States Patent
Wang et al.

(10) Patent No.: US 7,915,135 B2
(45) Date of Patent: Mar. 29, 2011

(54) METHOD OF MAKING MULTI-LAYER STRUCTURE FOR METAL-INSULATOR-METAL CAPACITOR

(75) Inventors: Chun-Kai Wang, Changhua County (TW); Chun-Chih Huang, Taoyuan County (TW); Chun-Ming Wu, Miaoli County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 49 days.

(21) Appl. No.: 12/432,772

(22) Filed: Apr. 30, 2009

(65) Prior Publication Data
US 2010/0279484 A1    Nov. 4, 2010

(51) Int. Cl.
*H01L 21/20* (2006.01)
*H01L 21/8242* (2006.01)

(52) U.S. Cl. ......... 438/396; 438/239; 438/253; 438/393

(58) Field of Classification Search .................. 438/396, 438/399, 42, 393, 3, 251–256, 381, 694, 438/710, 239, 444, 618, 622, 625, 627, 643, 438/250
See application file for complete search history.

(56) References Cited

U.S. PATENT DOCUMENTS

| | | | |
|---|---|---|---|
| 6,977,198 | B2 | 12/2005 | Gau |
| 7,592,664 | B2 * | 9/2009 | Lee ................................ 257/315 |
| 2007/0105257 | A1 * | 5/2007 | Park et al. ........................ 438/42 |
| 2008/0203528 | A1 * | 8/2008 | Shih et al. ...................... 257/532 |
| 2009/0085160 | A1 * | 4/2009 | Lee et al. ....................... 257/532 |

OTHER PUBLICATIONS

Kay Wang, Clement Huang, Vincent Wu, Joel Huang, Kelvin Yang, K I Huang, TS Wu and KC Su "Double Metal-Insulator-Metal Capacitor Breakdown Voltage Improvement by Stacked Film & Process Optimization in High-Voltage Process" 2008 Proceedings Twenty Fifth International VLSI Multilevel Interconnection Conference (VMIC) (Oct. 28-30, 2008) VMIC Catalog No. 08 IMIC—800, pp. 255-259.

* cited by examiner

*Primary Examiner* — Chuong A. Luu
(74) *Attorney, Agent, or Firm* — Winston Hsu; Scott Margo

(57) ABSTRACT

The present invention discloses a method of making a multi-layer structure for metal-insulator-metal capacitors, in which, a bottom electrode plate layer is formed on a substrate, wherein a Ti/TiN layer serving as a top anti-reflection coating (top ARC) of the bottom electrode plate layer including a titanium layer and a titanium nitride layer formed on the titanium layer is formed using a first and a second physical vapor deposition (PVD) processes at a temperature ranging from 25 to 400° C., and then a first capacitor dielectric layer, a middle electrode plate layer, a second capacitor dielectric layer, and a top electrode plate layer are formed on the bottom electrode plate layer in an order from bottom to top.

20 Claims, 4 Drawing Sheets

US 7,915,135 B2

METHOD OF MAKING MULTI-LAYER STRUCTURE FOR METAL-INSULATOR-METAL CAPACITOR

BACKGROUND OF THE INVENTION

1. Field of the Invention

The present invention relates to a method of making a multi-layer structure for making a metal-insulator-metal capacitor (MMC), and particularly to a method of making a multi-layer structure for making a double metal-insulator-metal capacitor (double MMC) structure having high capacitance density.

2. Description of the Prior Art

Various capacitor structures are used as electronic elements in integrated circuits such as radio frequency integrated circuits (RFIC), and monolithic microwave integrated circuits (MMIC).

Such capacitor structures include, for example, metal-oxide-semiconductor (MOS) capacitors, p-n junction capacitors and metal-insulator-metal (MIM) capacitors. For some applications, MIM capacitors can provide certain advantages over MOS and p-n junction capacitors because the frequency characteristics of MOS and p-n junction capacitors may be restricted as a result of depletion layers that form in the semiconductor electrodes. An MIM capacitor can exhibit improved frequency and temperature characteristics. Furthermore, MIM capacitors can be formed in the metal interconnect layers, thereby reducing CMOS transistor process integration interactions or complications.

Structurally, an MIM capacitor typically includes an insulating layer, such as a PECVD dielectric, disposed between lower and upper electrodes. To increase the circuit density and reduce the cost, large capacitance density is highly desirable. U.S. Pat. No. 6,977,198, issued Dec. 20, 2005 to Gau, assigned to United Microelectronics Corp., discloses a metal-insulator-metal (MIM) capacitor and a fabrication method for making it. The MIM capacitor has doubled capacitance per unit capacitor. Such MIM capacitor is also referred to as double MMC. As shown in FIG. 1, a MIM capacitor 10 comprises a first metal plate 12, a second metal plate 14 stacked above the first metal plate 12. The second metal plate 14 is electrically isolated from the first metal plate 12 by a first capacitor dielectric layer 13. A third metal plate 16 is stacked above the second metal plate 14 and is electrically isolated from the second metal plate 14 by a second capacitor dielectric layer 15. A cap layer 22 is deposited on the third metal plate 16. The cap layer 22 may be made of silicon oxide or silicon nitride. The MIM capacitor 10 is defined on a substrate 100 and covered with an inter-metal dielectric (IMD) layer 120. The first metal plate 12, the first capacitor dielectric layer 13, and the second metal plate 14 constitute a first capacitor ($C_1$) or lower capacitor. The second metal plate 14, the second capacitor dielectric layer 15, and the third metal plate 16 constitute a second capacitor ($C_2$) or upper capacitor. The first metal plate 12 of the MIM capacitor 10 is electrically connected to a first conductive terminal 42 through at least one conductive via 31 that penetrates through the IMD layer 120. The second metal plate 14 is electrically connected to a second conductive terminal 44 through at least one conductive via 32. The third metal plate 16 is electrically connected to the first conductive terminal 42 through at least one conductive via 33 that penetrates through the IMD layer 120 and the cap layer 22. This invention features a sandwich-like MIM capacitor structure consists of the lower capacitor $C_1$ and the upper capacitor $C_2$. The first metal plate 12, namely, one electrode of the lower capacitor $C_1$, is electrically coupled with the third metal plate 16, namely, one electrode of the upper capacitor $C_2$. The second metal plate 14 serves as a common electrode of the lower capacitor $C_1$ and the upper capacitor $C_2$ and is interposed between the first metal plate 12 and the third metal plate 16.

There is still a need for improvement of a double MMC structure to achieve higher breakdown voltage of double MMC (BVD) and longer time dependent dielectric breakdown (TDDB) lifetime.

SUMMARY OF THE INVENTION

One objective of the present invention is to provide a method of making a multi-layer structure. The multi-layer structure is suitable for making a metal-insulator-metal capacitor. Such obtained double MMC structure has relatively high BVD and long TDDB lifetime.

The method of making a multi-layer structure for a metal-insulator-metal capacitor includes steps of providing a substrate; forming a bottom electrode plate layer on the substrate, wherein a first Ti/TiN layer comprising a titanium layer and a titanium nitride layer on the titanium layer to serve as a top anti-reflection coating (top ARC) of the bottom electrode plate layer is formed using a first and a second physical vapor deposition (PVD) processes at a temperature in a range from 25 to 400° C.; forming a first capacitor dielectric layer on the top ARC; forming a middle electrode plate layer on the first capacitor dielectric layer; forming a second capacitor dielectric layer on the middle electrode plate layer; and forming a top electrode plate layer on the second capacitor dielectric layer.

In the present invention, the PVD processes are performed at temperatures in a range from 25 to 400° C. to form the top ARC of the bottom electrode plate layer, so that the dielectric layer formed thereon may be relatively smooth with respect to roughness, and such obtained double MMC may have a higher BVD and a longer TDDB lifetime without affecting the capacitance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
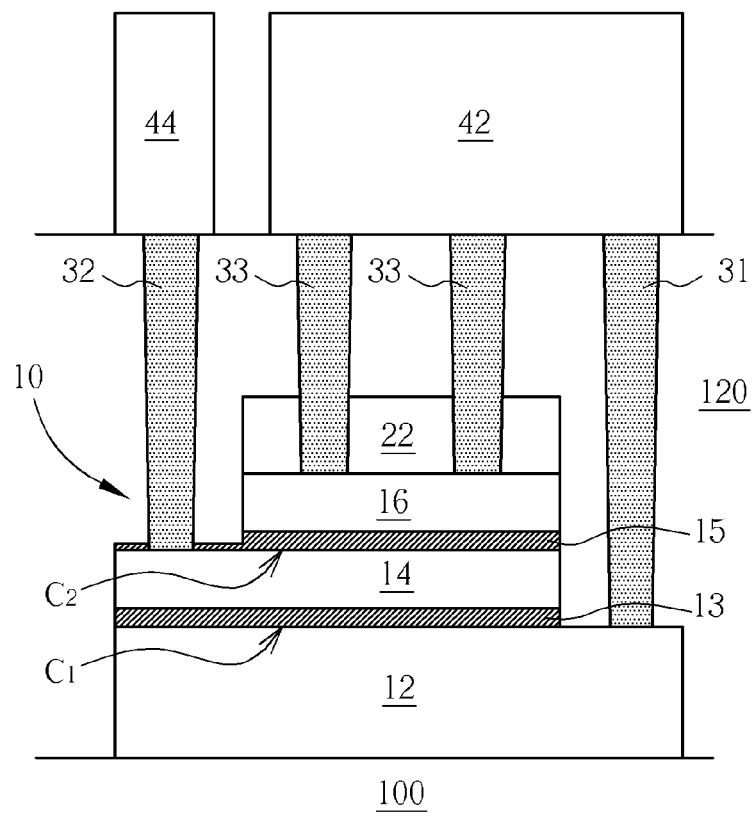
FIG. 1 is a schematic cross-sectional view illustrating a conventional double MMC structure.
Figure 2:
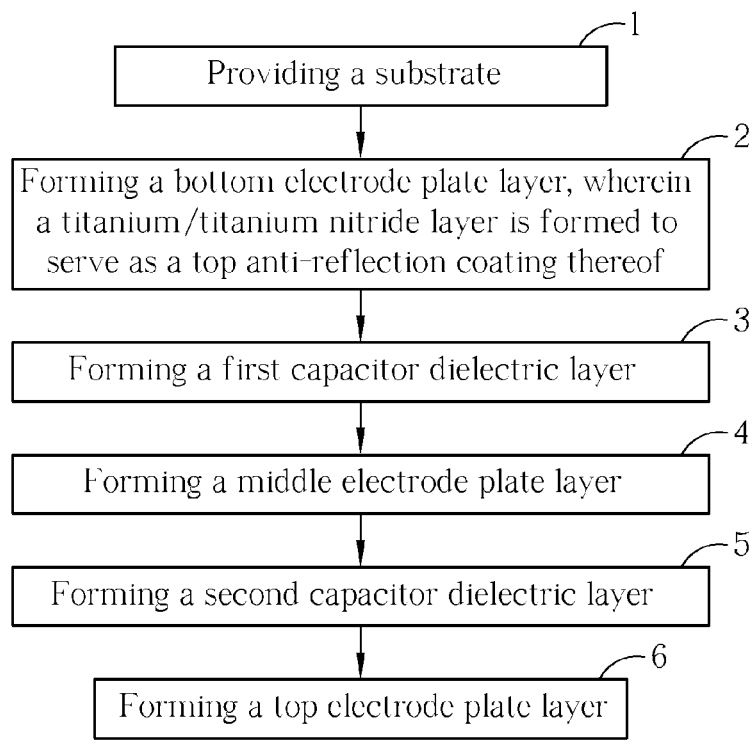
FIG. 2 is a flow chart illustrating the method of making a multi-layer structure for a metal-insulator-metal capacitor according to the present invention.

FIG. 2 is a flow chart illustrating the method of making a multi-layer structure for use to make a metal-insulator-metal capacitor, according to the present invention. The method of the present invention includes a step 1 of providing a substrate. It may be any substrate, such as a wafer which may have semiconductor devices formed thereon, on which a capacitor structure is required to be built. Thereafter, a step 2 is performed to form a bottom electrode plate layer on the substrate. In the step 2, a first Ti/TiN layer comprising a titanium layer and a titanium nitride layer on the titanium layer is formed to serve as a top ARC of the bottom electrode plate layer using a first physical vapor deposition (PVD) and a second PVD processes at a temperature in a range from 25 to 400° C. That is, the bottom electrode plate layer is formed of a multilayer structure. Since one of the features of the present invention is the formation of the top ARC of the bottom electrode plate layer, the layer beneath the top ARC is not particularly limited to any material, as long as it is suitable to serve as an electrode plate of the capacitor and can form a well-stacked multi-layer structure with the top ARC together.

Formation of the bottom electrode plate layer is described more specifically as follows. The lower layer of the bottom electrode plate layer may be metal, or may be a Ti/TiN layer, serving as a liner, formed on the substrate and an aluminum (Al) layer formed on the Ti/TiN layer. The Ti/TiN layer may be formed through formation of a titanium layer using for example a PVD process at room temperature and formation of a titanium nitride layer on the titanium layer using for example a PVD process at room temperature. There after an aluminum layer may be formed on the TiN layer by for example a PVD process at for example 400° C. Thereafter, the top ARC is formed. The top ARC is a multi-layer including a titanium layer and a titanium nitride layer stacked on the titanium layer. The top ARC is formed by a PVD process at a particular temperature range from 25 to 400° C. In detail, a titanium layer is deposited on the aluminum layer by a PVD process and a titanium nitride layer is deposited on the titanium layer by a PVD process to form the Ti/TiN layer. The thickness of each layer depends on the light wavelength to be used in the following processes, such that the anti-reflection effect can be achieved during a microlithography process for patterning a photo-resist layer in the high density capacitor manufacturing process.

Thereafter, a step 3 is performed to form a first capacitor dielectric layer on the top ARC, that is, forming a dielectric layer, such as, an ONO layer (oxide-nitride-oxide layer), an ultra-violet silicon nitride layer (UVSiN layer), or a PEOX layer on the titanium nitride layer of the top ARC. The UVSiN layer has a good UV light transmittance and is suitably used in products having a function of UV erase to delete data stored in dies by irradiation of UV light on chips. The PEOX layer is an oxide layer formed by a plasma-enhanced CVD process.

When the top ARC (i.e. Ti/TiN layer) of the bottom electrode plate is formed at a temperature in a range from 200 to 400° C., especially 250 to 380° C., double MMC devices having high BVD and high capacitance can be obtained by forming the ONO layer, the UVSiN layer, or the PEOX layer to serve as the first capacitor electric layer.

When the top ARC (i.e. Ti/TiN layer) of the bottom electrode plate is formed at a temperature in a range from 25 to 150° C., the ONO layer and the UVSiN layer are preferred to serve as the first capacitor dielectric layer. The capacitors formed from such multi-layer structure still have high BVD and high capacitance. However, BVD is reduced when using the PEOX layer as the first capacitor dielectric layer.

Thereafter, a step 4 is performed to form a middle electrode plate layer on the first capacitor dielectric layer. The material of the middle electrode plate is not particularly limited as long as it is suitable for serving as an electrode plate of a capacitor and can be well stacked with the underlying first capacitor dielectric layer to form a multi-layer structure. It may be for example metal, which may be for example a Ti/TiN layer formed by for example PVD processes.

Thereafter, a step 5 is performed to form a second capacitor dielectric layer on the middle electrode plate layer. The material of the second capacitor dielectric layer is not particularly limited as long as it is suitable for serving as a dielectric layer of a capacitor and can be well stacked with the underlying middle electrode plate layer to form a multi-layer structure. For convenience, it may be the same material as the first capacitor dielectric layer.

Thereafter, a step 6 is performed to form a top electrode plate layer on the second capacitor dielectric layer. The material of the top electrode plate is not particularly limited as long as it is suitable for serving as an electrode plate of a capacitor and can be well stacked with the underlying second capacitor dielectric layer to form a multi-layer structure. It may be for example a metal, which may be for example a Ti/TiN layer formed by for example a PVD process.

Figure 3:
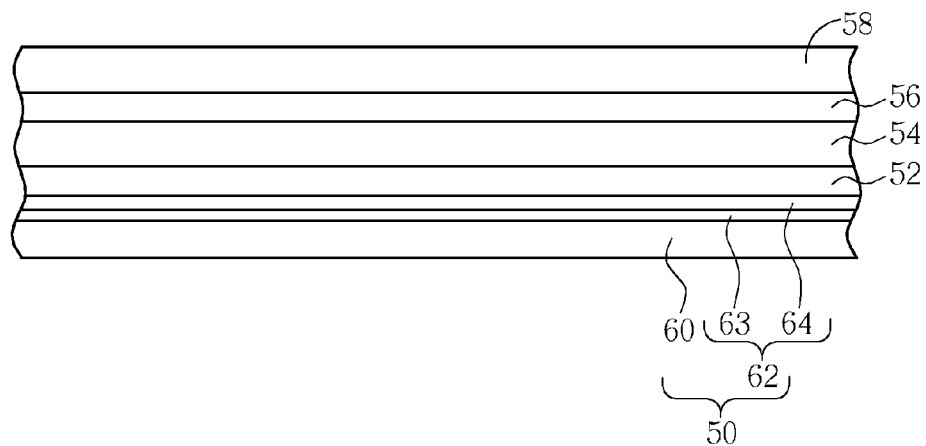
FIG. 3 is a schematic cross-sectional view showing the multi-layer structure made using the method of the present invention.

A multi-level structure formed using the method of the present invention as shown in FIG. 3 is formed on a substrate 100 and includes, from bottom to top, a bottom electrode plate layer 50, a first capacitor dielectric layer 52, a middle electrode plate layer 54, a second dielectric layer 56, and a top electrode plate layer 58. The bottom electrode plate layer 50 further includes, from bottom to top, a lower layer 60 and a top ARC 62. The top ARC 62 includes, from bottom to top, a titanium layer 63 and a titanium nitride layer 64. The lower layer 60 may further include, from bottom to top, a titanium layer, a titanium nitride layer, and an aluminum layer. Each layer may have a thickness as desired and is not particularly limited. In one preferred embodiment according to the present invention, each layer of the Ti/TiN/Al/Ti/TiN layer serving as the bottom electrode plate layer may have a thickness of 20-200 Å, 100-300 Å, 1500-5000 Å, 20-200 Å, and 100-1000 Å, respectively; the first capacitor dielectric layer may have a thickness of 300-600 Å; the middle electrode plate layer may have a thickness of 1000-1500 Å; the second dielectric layer may have a thickness of 300-600 Å; and the top electrode plate layer may have a thickness of 1000-1500 Å. However, the present invention is not limited thereto, and each layer may have a thickness depending on requirement for devices.

Figure 4:
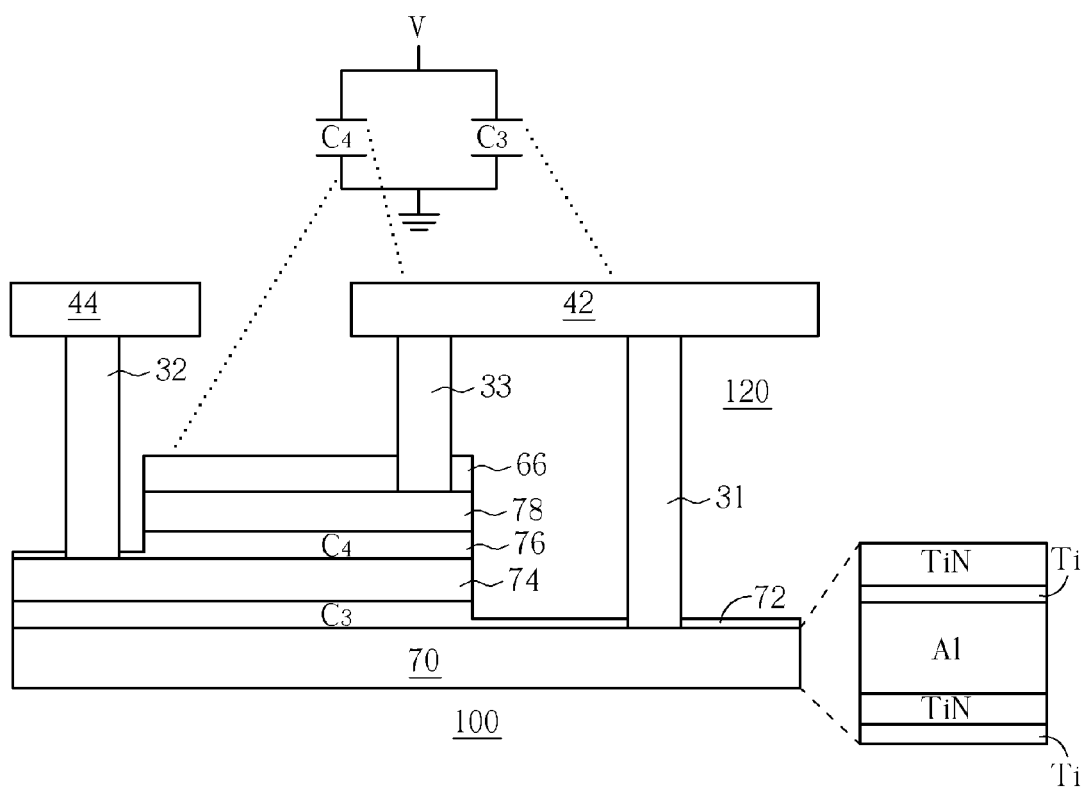
FIG. 4 is a schematic cross-sectional view showing a double MMC structure made from the multi-layer structure made using the method of the present invention.

A cap layer may be further formed on the top surface of the aforesaid multi-level structure, with a thickness of for example 1000-2000 Å. The multi-layer structure is suitable for making the double MMC structure having a high density as shown in FIG. 4. It may be formed through conventional photolithograph, etching, plug formation processes, and others as required. The capacitor structure is formed on the substrate 100 and in the IMD layer 120. The bottom metal plate 70, the first capacitor dielectric layer 72, and the middle metal plate 74 constitute a lower capacitor structure ($C_3$). The middle metal plate 74, the second capacitor dielectric layer 76, and the top metal plate 78 constitute an upper capacitor structure ($C_4$). A portion of the bottom electrode plate 70 is covered with the first capacitor dielectric layer 72 with a residual thickness. A portion of the middle electrode plate 74 is covered with the second capacitor dielectric layer 76 with a residual thickness. The bottom metal plate 70 is electrically connected to a first conductive terminal 42 through at least one conductive via 31 that penetrates through the IMD layer 120 and the first capacitor dielectric layer 72 with the residual thickness. The middle metal plate 74 is electrically connected to a second conductive terminal 44 through at least one conductive via 32 that penetrates through the IMD layer 120 and the second capacitor dielectric layer 76 with the residual thickness. The top metal plate 78 is electrically connected to the first conductive terminal 42 through at least one conductive via 33 that penetrates through the IMD layer 120 and a cap layer 66. The bottom electrode plate 70 is electrically connected with the top electrode plate 78 to form a sandwich-like MIM capacitor structure including the middle electrode plate 74 interposed between the bottom electrode plate 70 and the top electrode plate 78. The bottom electrode plate is formed using Metal-3 of the metal interconnect layer of the semiconductor device. The first and second conductive terminals 42 and 44 are formed using Metal-4 of the metal interconnect layer of the semiconductor device.

In order to determine the properties of the multi-level structure formed using the method of the present invention, a pinhole test is carried out on the surface of the aforesaid ONO, UVSiN, and PEOX dielectric layers to observe the roughness of the surface of these multi-level structures. The pinhole test is carried out by dipping the test wafers in an aqueous solution of $NH_4OH$ and $H_2O_2$ for 1.5 hours and then the test wafers are annealed at 400° C. for 12 minutes, and then the test wafer surface is observed using an optical microscope. The test wafers are prepared as follows: coating a PETEOS oxide film (an oxide film formed through a PECVD process of TEOS) of 5000 angstroms (Å) on p-type wafers, then depositing an aluminum layer of 5000 Å, a titanium layer of 50 Å, and a titanium nitride layer of 500 Å in the order, the titanium layer and the titanium nitride layer together forming a top ARC, followed by depositing ONO, UVSiN, and PEOX capacitor dielectric layers of a thickness depending on requirement for devices on the top ARC of the wafers, respectively. It can be observed that when the top ARC is formed at 100° C., the pinhole density will be slightly higher than that of the top ARC formed at 300° C. Such situation is especially significant to the PEOX capacitor dielectric layer; that is, when the top ARC is formed at the temperature of 100° C., the pinhole density of the surface of the PEOX capacitor dielectric layer is particularly high. The rough interface between the dielectric layer and the bottom electrode plate will remarkably reduce breakdown voltage.

Figure 5:
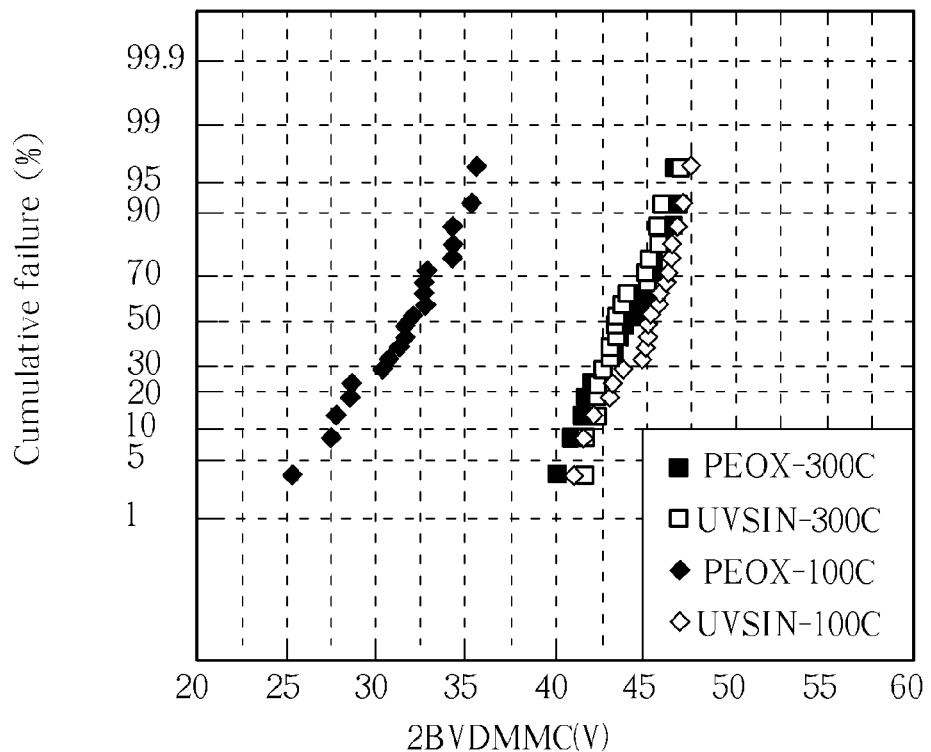
FIGS. 5 and 6 are plots of the results of determination of BVD and capacitance of the double MMC made from the multi-layer structure made using the method of the present invention, respectively.
Figure 6:
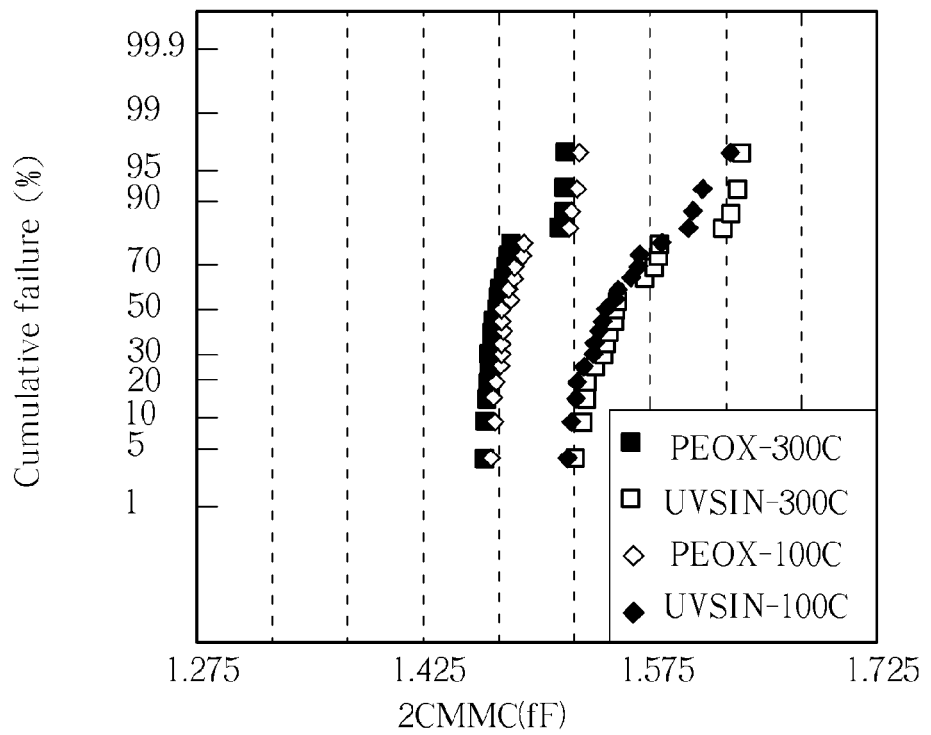

The breakdown voltage and capacitance of the double MMC devices, as shown in FIG. 4, made from the multi-level structure formed by the method of the present invention are determined. The cumulative failure (%) is plotted versus the breakdown voltage of the double MMC (2BVDMMC) (unit: volt), and the cumulative failure (%) is plotted versus the capacitance of the double MMC (2CMMC) (unit: fF). The results are shown in FIGS. 5 and 6, respectively. In case the dielectric layer is a UVSiN layer, the process temperature of top ARC (such as 300° C. or 100° C.) will not affect the breakdown voltage; however, in case the dielectric layer is a PEOX layer, the process temperature of top ARC at 100° C. will reduce the breakdown voltage. Furthermore, in case the dielectric layer is a UVSiN layer, the capacitance is relatively high.

Figure 7:
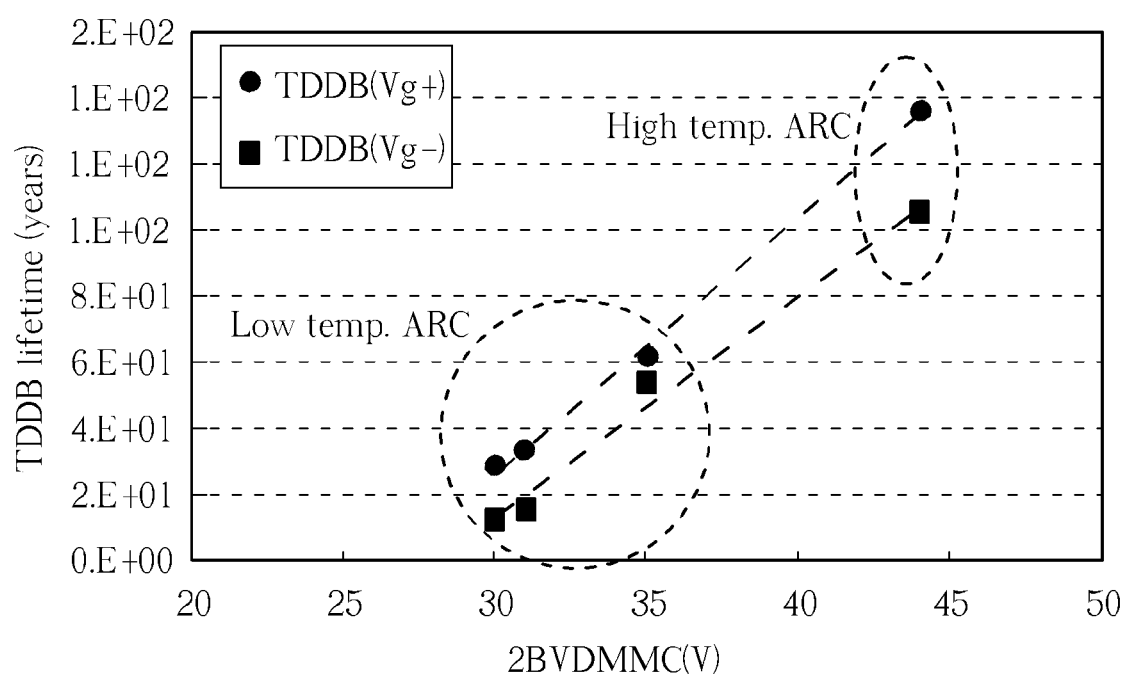
FIG. 7 is a plot of PLR-TDDB versus WLR-BVD of the double MMC made from the multi-layer structure made using the method of the present invention.

FIG. 7 is a plot of PLR (package-level reliability)-TDDB versus WLR (wafer-level reliability)-BVD of the double MMC, as shown in FIG. 4, made from the multi-layer structure made using the method of the present invention. The capacitor dielectric layer is a PEOX layer. $Vg^+$ indicates the positive voltage applied on Metal-4 patterned into the first and second conductive terminals 42 and 44, and the stress current flows from Metal-4 to Metal-3. $Vg^-$ indicates the positive voltage applied on Metal-3, i.e. the bottom electrode plate layer, and the stress current flows from Metal-3 to Metal-4. It can be seen from FIG. 7 that when the top ARC is formed at a higher temperature such as 300° C., the obtained double MMC has a relatively high BVD and long TDDB lifetime, and when the top ARC is formed at a lower temperature down to such as 100° C., the obtained double MMC has a relatively low BVD and short TDDB lifetime.

In comparison with conventional techniques, the inventors found that in the formation of the top ARC, the PVD process temperatures are properly selected in accordance with the capacitor dielectric layer material to be used in the subsequent process. The double MMC device made from such obtained multi-layer structure may have higher BVD and longer TDDB lifetime than those of conventional double MMC.

All combinations and sub-combinations of the above-described features also belong to the present invention. Those skilled in the art will readily observe that numerous modifications and alterations of the device and method may be made while retaining the teachings of the invention.

What is claimed is:

1. A method of making a multi-layer structure for a metal-insulator-metal capacitor, comprising:
providing a substrate;
forming a bottom electrode plate layer on the substrate, wherein a first Ti/TiN layer comprising a titanium layer and a titanium nitride layer on the titanium layer to serve as a top anti-reflection coating (top ARC) of the bottom electrode plate layer is formed using a first and a second physical vapor deposition (PVD) processes at a temperature in a range from 25 to 400° C.;
forming a first capacitor dielectric layer on the top anti-reflection coating;
forming a middle electrode plate layer on the first capacitor dielectric layer;
forming a second capacitor dielectric layer on the middle electrode plate layer; and
forming a top electrode plate layer on the second capacitor dielectric layer.

2. The method of claim 1, wherein the first capacitor dielectric layer comprises an ONO dielectric layer.

3. The method of claim 1, wherein the first capacitor dielectric layer comprises a UVSiN dielectric layer.

4. The method of claim 3, wherein the first Ti/TiN layer is formed using the first and the second physical vapor deposition process at a temperature of 300° C.

5. The method of claim 1, wherein the first capacitor dielectric layer comprises a PEOX dielectric layer.

6. The method of claim 5, wherein the first Ti/TiN layer is formed using the first and the second physical vapor deposition process at a temperature in a range from 200 to 400° C.

7. The method of claim 1, wherein the bottom electrode plate layer further comprises a metal layer beneath the top anti-reflection coating.

8. The method of claim 7, wherein the metal layer an aluminum layer.

9. The method of claim 8, wherein the metal layer further comprises a second Ti/TiN layer beneath the aluminum layer.

10. The method of claim 1, wherein the middle electrode plate layer comprises a metal layer.

11. The method of claim 10, wherein the metal layer comprises a third Ti/TiN layer.

12. The method of claim 1, wherein the top electrode plate layer comprises a metal layer.

13. The method of claim 12, wherein the metal layer comprises a fourth Ti/TiN layer.

14. The method of claim 1, further comprising forming a cap layer on the top electrode plate layer.

15. A method of making a multi-layer structure for a metal-insulator-metal capacitor, comprising:

providing a substrate;

forming a bottom electrode plate layer on the substrate;

forming a first Ti/TiN layer comprising a titanium layer and a titanium nitride layer on the titanium layer on the bottom electrode plate layer to serve as a top anti-reflection coating (top ARC) of the bottom electrode plate layer using a first and a second physical vapor deposition (PVD) processes at a temperature in a range from 25 to 400° C.;

forming a first capacitor dielectric layer on the top anti-reflection coating;

forming a middle electrode plate layer on the first capacitor dielectric layer;

forming a second capacitor dielectric layer on the middle electrode plate layer; and forming a top electrode plate layer on the second capacitor dielectric layer.

16. The method of claim 15, wherein the first capacitor dielectric layer comprises an ONO dielectric layer.

17. The method of claim 15, wherein the first capacitor dielectric layer comprises a UVSiN dielectric layer.

18. The method of claim 17, wherein the first Ti/TiN layer is formed using the first and the second physical vapor deposition process at a temperature of 300° C.

19. The method of claim 15, wherein the first capacitor dielectric layer comprises a PEOX dielectric layer.

20. The method of claim 19, wherein the first Ti/TiN layer is formed using the first and the second physical vapor deposition process at a temperature in a range from 200 to 400° C.

* * * * *